United States Patent [19]
Hull et al.

[11] Patent Number: 5,017,919
[45] Date of Patent: May 21, 1991

[54] DIGITAL-TO-ANALOG CONVERTER WITH BIT WEIGHT SEGMENTED ARRAYS

[75] Inventors: Richard W. Hull, Laguna Hills; Timothy G. O'Shaughnessy, Norco, both of Calif.

[73] Assignee: Western Digital Corporation, Irvine, Calif.

[21] Appl. No.: 533,885

[22] Filed: Jun. 6, 1990

[51] Int. Cl.5 ............................................. H03M 1/68
[52] U.S. Cl. .................................... 341/136; 341/145; 341/153
[58] Field of Search ............... 341/133, 134, 135, 136, 341/144, 145, 153, 154

[56] References Cited

U.S. PATENT DOCUMENTS

| | | | |
|---|---|---|---|
| 4,064,506 | 12/1977 | Cartwright, Jr. | 341/136 X |
| 4,311,988 | 1/1982 | Kelly et al. | 341/145 |
| 4,393,370 | 7/1983 | Hareyama | 341/136 |
| 4,553,132 | 11/1985 | Dingwall et al. | 341/136 |
| 4,558,242 | 12/1985 | Tuthill et al. | 341/136 X |
| 4,583,076 | 4/1986 | Luschnig | 341/144 X |
| 4,635,038 | 1/1987 | Winch | 341/136 |
| 4,725,813 | 2/1988 | Miyada | 341/136 X |
| 4,800,365 | 1/1989 | White et al. | 341/136 X |
| 4,827,260 | 5/1989 | Sugawa et al. | 341/144 X |
| 4,859,930 | 8/1989 | Schouwenaars et al. | 341/133 |

Primary Examiner—A. D. Pellinen
Assistant Examiner—H. L. Williams
Attorney, Agent, or Firm—Christie, Parker & Hale

[57] ABSTRACT

A DAC embodied in a CMOS integrated circuit converts a multi-bit digital signal to an analog-current signal. A higher-order portion of the digital signal, e.g., the most significant 5 bits of a byte, are decoded separately from the lower-order portion, e.g., the 3 least significant bits. The DAC includes circuitry for producing a first bias voltage, a first set of current sources each biased by the first bias voltage to produce a switchable current having a unit magnitude, and switching circuitry controlled by the decoded lower-order portion to cause a selected number of the unit-magnitude currents to contribute to the analog-current signal. The DAC further includes circuitry for producing a second bias voltage, a second set of current sources each biased by the second bias voltage to produce a switchable current having a multi-unit magnitude, and switching circuitry controlled by the decoded higher-order portion to cause a selected number of the multi-unit-magnitude currents to contribute to the analog-current signal.

23 Claims, 9 Drawing Sheets

DIGITAL-TO-ANALOG CONVERTER WITH BIT WEIGHT SEGMENTED ARRAYS

CROSS REFERENCE TO RELATED APPLICATION

U.S. patent application Ser. No. 07/533,890, filed by T. O'Shaughnessy and M. Spaur on the same date as the present application, titled "Stability Compensated Operational Amplifier" and assigned to the assignee of the present invention discloses and claims subject matter relevant to the present application, and the disclosure thereof is hereby incorporated by reference.

BACKGROUND OF THE INVENTION

1. Field of the Invention

In general, this invention relates to integrated-circuit apparatus for converting data from digital form to analog form. More particularly, it relates to such apparatus which is efficient in use of die area and which provides accurate signal conversion.

2. Description of the Prior Art

A digital-to-analog converter (DAC) constitutes apparatus for converting data from digital form to analog form. The digital form of the data is a multi-bit digital signal that defines an arbitrary one of a set of discrete values in each of a group of multiple bits. For example, an 8-bit digital signal, typically referred to as a byte, can define any arbitrary one of a set of 256 discrete values. The analog form of the data is, in general, a continuously-variable unitary signal, e.g., either a current or a voltage the magnitude of which defines the analog value. Ideally, the analog values defined by the analog-signal output of the DAC are in one-to-one correspondence with the set discrete values defined by the multi-bit digital signal.

There are numerous systems which require a DAC. A DAC is needed in essentially any system that includes apparatus that requires an analog-signal input to operate, and also includes digital data processing circuitry for controlling such apparatus. One example of such a system is a disk drive head positioning control system. In operation of such a control system, digital data processing circuitry, which generally includes a microprocessor, produces a multi-bit digital signal that sequentially defines discrete values. A DAC in the control system receives the digital signal and produces an analog signal that sequentially defines corresponding analog values. The analog signal is used to control a motor within a head actuator assembly to move the head to a desired position relative to a rotating disk surface. Another example of the numerous systems which require a DAC is a video display system which includes digital circuitry, and an analog monitor controlled by the analog signal produced by the DAC in response to a multi-bit digital signal produced by the digital circuitry.

Because a DAC has such extensive applicability in numerous systems, substantial efforts have been expended over the years to develop DAC technology. Such efforts have in numerous cases been directed to embodying a DAC in an integrated circuit. Prior efforts have involved various approaches that have failed to provide an adequate solution to certain problems that arise in designing an integrated circuit.

One such problem, which confronts the designer of any DAC and which is especially difficult in the design of an integrated circuit DAC, relates to the requirement for the DAC to provide a monotonic relationship between the output analog signal and the digital input signal. A monotonic relationship exists if progressively increasing discrete values of the input digital signal are always converted to progressively increasing analog values of the output analog signal. In other words, a monotonic relationship exists if a plot of the analog value of analog output signal as a function of the discrete value of the input digital signal resembles a staircase. Ideally, each step of the staircase is the same size; in such an ideal case, a straight line drawn through the plot intersects the corner of each step, and a linear relationship, as well as a monotonic relationship, exists. If the steps vary in size, even though the steps are monotonic, a non-linear relationship exists.

Non-linearity can be defined in two ways. One of these is referred to as differential non-linearity (DNL), the other as integral non-linearity (INL). DNL relates to the extent to which a given analog step differs from a desired unit step. INL relates to the extent to which a given analog value differs from a desired value. If, e.g., the first two steps have the same magnitude DNL, but opposite sign, the INL at the top of the second step would be zero.

Another problem confronting the designer of an integrated circuit DAC is to provide an arrangement that is efficient in use of die space. A DAC that occupies an undue amount of die space is undesirable because, for a fixed size die, less die space will be available for other circuitry in the die, and because increasing the die size increases the cost of production. Further, certain process-caused device-to-device tolerances increase with the distance between discrete devices in the die, and thereby aggravate design problems.

Of the various approaches that in the prior art have been proposed for a complementary metal oxide semiconductor (CMOS) integrated circuit DAC, a first type of approach is brute force in nature in seeking to ensure monotonicity, and involves the use of a very large number of switched current sources, every one of which receives the same bias voltage produced by a single bias source. Implementing each switched current source in an integrated circuit requires numerous transistors. CMOS integrated circuitry has two basic types of transistors—one type being referred to as either a p-type or a p-channel field effect transistor (FET) and the other type being referred to either as an n-type or n-channel FET. A switched current source can be implemented with three FETs of either type. One of the three FETs serves as a source of a constant current referred to interchangeably as a unit current or a least significant bit (LSB) current, and the other two FETs in combination form a differential switch that is controlled to steer the unit current such that the unit current either does or does not contribute to an analog current signal. When its unit current is steered to contribute to the signal, the switched current source is said to be on; otherwise, it is said to be off. By providing (N−1) switched current sources in a DAC for converting a digital signal that can define N discrete values, and switching an additional one on for each incremental one of the discrete values, monotonicity is virtually ensured. This approach has numerous disadvantages. To begin with, a DAC in accord with this prior art approach includes approximately the same number of switched current sources as the number of discrete values of the digital input signal. For example, in an 8-bit DAC, 255 switched current sources are required in accord with this approach. With three FETs per switched current source, a total of 765 FETs are required to implement the switched current sources. Other FETs are required to implement decoding structures, etc. Thus, a DAC in accord with this approach is inefficient in use of die space. Furthermore, this approach does not necessarily provide acceptable linearity.

A second of the various prior art approaches centers on the use of binary-weighted switched current sources, every one of which receives the same bias voltage produced by a single bias source. FIG. 1 depicts relevant features of a DAC in accord with this prior art approach. Certain circuitry required by the DAC is not shown in FIG. 1 because an explanation of the details of such circuitry is not necessary for an understanding of the binary-weighting approach. In FIG. 1, a single bias-voltage source 100 is connected to a reference current path 102. A reference current $I_r$ flows in the path 102. This reference current can be supplied to the integrated circuit from an external source, or can be produced internally. In response to the reference current $I_r$ flowing in the path 102, source 100 produces a common bias (CBIAS) voltage. Circuitry not shown produces a switch bias (SBIAS) voltage. Other circuitry not shown decodes a 3-bit digital signal to produce three switch control signals $D_0$, $D_1$, and $D_2$. Binary-weighted switched current sources are arranged into three stages to provide for converting the three-bit digital signal to an analog signal. Each stage includes three FETs One of the three FETs in a stage serves as a source of a constant current the magnitude of which depends upon the CBIAS voltage, and on the ratio of its channel width to its channel length (W/L). In combination, the other two FETs in a stage form a differential switch that is controlled to steer the constant current such that the constant current either does or does not contribute to the analog current signal. A FET 104 in a first stage serves as the source of a first switchable current I(0); a FET 106 in a second stage serves as the source of a second switchable current I(1); and a FET 108 in a third stage serves as the source of a third switchable current I(2). The differential switches in all stages receive the SBIAS voltage. The differential switches are respectively controlled by the three switch control signals $D_0$, $D_1$, and $D_2$. The differential switch controlled by the $D_0$ signal comprises a FET 110 and a FET 112. FET 110 is turned on or off in accord with the binary value of signal $D_0$. While on, FET 110 provides a current sink such that current I(0) flows to ground. While FET 110 is off, current I(0) flows through FET 112 to DAC output 114 such that a voltage can be developed across a resistive load 116. The differential switches controlled by the $D_1$ and $D_2$ signals comprise FETs 118, 120, 122, and 124. FETs 118 and 120 are turned on or off in accord with the binary value of signals $D_1$ and $D_2$, respectively. Each of these FETs, while on, provides a current sink such that either current I(1) or current I(2), or both, flows to ground. FETs 120 and 124 propagate currents I(1) and I(2) to the DAC % output while FETs 118 and 122 are off, respectively.

The structure shown in FIG. 1 can be extended with additional binary-weighted stages; for example eight stages can be provided for converting a byte to an analog signal. It bears mention that, this approach has only one switched current source per bit position of the digital signal whereas the brute force approach described above has one switched current source per discrete value of the digital signal.

The prior art approach embodied in the DAC of FIG. 1 requires that the magnitudes of the switchable currents conform to a binary sequence; i.e., the magnitude of I(1) must be twice the magnitude of I(0), and the magnitude of I(2) must be four times the magnitude of I(0). If each of the three switchable currents flows through a respective current-sinking FET, no current flows through the DAC output, and zero volts is developed across load 116. If none of the three switchable currents flows through a respective current-sinking FET, the three currents combine to flow through the DAC output, and a maximum voltage is developed across load 116.

The magnitude of each of the switchable currents depends on certain parameters of, and the operating conditions of, the respective current-sourcing FET. The parameters are referred to as K', W/L, and $V_t$; the operating conditions are that the FET operates in its saturation region such that its drain current is essentially independent of variations in its drain voltage and is dependent on its gate-to-source voltage ($V_{gs}$). The K' parameter of a FET depends upon its gate oxide thickness. The W/L parameter of a FET is the ratio of its channel width to its channel length. The V parameter of a FET is its MOS threshold voltage. The functional relationship of FET saturation drain current $I_d$ is given by the following equation:

$$I_d = (K'/2)(W/L)(V_{gs} - V_t)^2$$

In designing a DAC in accord with the prior art approach of FIG. 1, the designer selects a different W/L ratio for each current-sourcing FET, in accord with a binary-weighted sequence. In further explanation of this point, the W/L ratio for FET 104 is referred to as "W/L(0)"; the W/L ratio for FET 106 is referred to as "W/L(1)", and so forth. In accord with the binary-weighted sequence, W/L(2) is selected to be four times W/L(0), and W/L(1) is selected to be twice W/L(0). If all other things were equal, the drain current I(0) of FET 104 would define the unit current or LSB current, and the drain currents I(1) and I(2) of FETs 106 and 108 would be, respectively, two times and four times the LSB current.

Numerous factors contribute to inaccuracy of a prior art DAC in accord with FIG. 1. One factor is that, as a result of varying conditions occurring during the fabrication process, spaced-apart FETs, even on the same die, vary with respect to MOS threshold voltage ($V_t$). A typical worst case variation of $V_t$ across a die is $+/-10$ millivolts (mv). Another factor is that spaced-apart FETs vary with respect to the extent to which their actual W/L parameter conforms to the intended design. A fixed dimensional tolerance has an increasingly adverse effect on the percentage variation from intended design as attempts are made to design for smaller W/L parameters as part of an effort to reduce the area of die space occupied by the DAC circuitry. Another factor is variation in the K' parameter. Each of the foregoing factors contributes to mismatch in the drain currents of the current-sourcing FETs of a prior art DAC in accord with FIG. 1. In this context, mismatch refers to a departure from the intended 2-to-1 ratio of adjacent-stage currents. In general, the relative contribution of these factors to such mismatch is the worst for MOS threshold voltage variations, next for W/L variations, and the least for K' variations.

The adverse effects of these factors in a prior art DAC in accord with FIG. 1 are underscored by considering a concrete example in which the DAC has eight stages for converting an input byte, and the input byte increments from a mid-range value. Expressed in binary form, such mid-range value is 01111111, and the incremented value is 10000000. In response to the mid-range value, each of the seven lower order stages of the DAC contributes to the DAC output current. After incrementation, the highest order stage of the DAC supplies all of the DAC output current. With respect to the effects of mismatch, threshold voltage variations generally produce the most adverse effects. In circumstances in which the current-sourcing FET of the highest order stage differs from the FETs of the other stages with respect to MOS threshold voltage such that the $(V_{gs}-V_t)^2$ for the current-sourcing FET of highest order stage is in error by as little as 2% relative to the other current-sourcing FETs, the non-linearity of the DAC output is 2.56 times the unit current (LSB). As to the effects of W/L variations, the degree of non-linearity introduced by these effects depend upon process tolerances relative to the sizes of the FETs. In circumstances in which the minimum designed width (for the LSB current generator) is 10 microns (whereby the width of the highest ordered of the binary-weighted switched current sources would be 1280 microns), and in which there is a +/−1 micron tolerance on width, the actual widths of the relevant FETs, in microns, would be 9, 19, 39, et seq., instead of 10, 20, 40, et seq. At the mid-range discrete value of 127 (01111111, in binary), the magnitude of the analog current would actually be 126.3 units instead of a designed number of 128 units. Upon incrementation from the mid-range value, the magnitude of the actual analog current would be 127.9 units instead of a designed number of 128 units. Thus, a step of 1.6 times the unit current would result instead of the desired step of 1.0 times the unit current.

A third prior art approach uses fewer switched current sources than the brute force approach, but more than the binary-weighted switched current source approach, and like both of those approaches employs a single bias source to provide the same bias voltage to every one of the switched current sources. In accord with this third approach, the commonly-biased switched current sources are partitioned or split into two groups that can be referred to as a high-order group and a low-order group. For example, an 8-bit DAC in accord with this approach can include 15 switched current sources in the low-order group, each current-sourcing FET of which is designed to have the same width so as to supply the same magnitude current—i.e., the unit or LSB current, and further include 15 switched current sources in the high-order group, each current-sourcing FET of which is designed to be 16 times wider than the width of a current-sourcing FET in the low-order group.

In operation of an 8-bit DAC in accord with this third prior art approach, the four least significant bits of the input byte control the switching of the 15 LSB current generators in the low-order group. The four most significant bits of the input byte control switching of the 15 MSB current generators in the high-order group.

This third approach also suffers from disadvantages with respect to inaccuracies that arise from process-caused variations in parameters. The adverse effects of tolerance on W/L can be quantified by reference to a concrete, representative example in which each of the 15 current-sourcing FETs in the low-order group is designed to be 10 microns, and each of the 15 current-sourcing FETs in the high order group is designed to be 160 microns. If every one of these 30 FETs is actually 1 micron thinner than its designed width, the actual widths would be 9 microns and 159 microns. If all other parameters are equal, the actual current supplied by each current-sourcing FET in the high-order group would produce 17.7 (i.e., 159/9) times the actual current supplied by one of the current-sourcing FETs in the low-order group. This involves an error that is 1.7 times the LSB current.

MOS threshold voltage variation across the die is another source of error that bears consideration with respect to this representative example. A +/−10 mv. tolerance on $V_t$ across a die can result in approximately a two per cent error in the analog current. Assuming a worst case of all LSB elements in a DAC having maximum positive tolerance while an MSB element has maximum negative tolerance, results in current level produced by 15 LSB elements of 15.3 LSB current units. The MSB element would produce 15.68 LSB current units, resulting in a transition step from 15 LSB current elements to 1 MSB current element of only 0.38 LSB current units.

SUMMARY OF THE INVENTION

The present invention provides an integrated circuit DAC that has numerous advantages over the DACs embodying the above-described prior art approaches; these advantages include efficient use of die space and accuracy of conversion. A DAC embodying the present invention comprises means defining certain flow paths. A first flow path is for a reference current which can, if desired, be produced externally of, and be brought into through a pin of, the integrated circuit, or, if desired, be generated within the integrated circuit. A second flow path is for an analog current, the magnitude of which defines the analog signal. If desired, the analog current can be converted to an analog voltage, either within or outside the integrated circuit, by conducting it through a resistive load. The DAC further includes current-to-voltage converting circuit means connected to the first flow path for producing a first bias voltage having a magnitude that depends upon the magnitude of the reference current. The DAC further includes first current-sourcing means biased by the first bias voltage for producing, in parallel, a first plurality of switchable currents that each mirror the reference current. First switching means controlled by the digital value of a low-order portion of the digital signal provide for selectively switching the first plurality of switchable currents to the second flow path so as to contribute unit steps to the analog signal. A distinguishing and highly advantageous feature of the DAC involves a combination of circuit means that cooperate to produce a second bias voltage the magnitude of which is controlled by a summed current produced in the DAC. In this combination, circuit means biased by the first bias voltage produce the summed current such that it has a magnitude that is a multiple of the magnitude of the reference current. Circuit means responsive to the summed current produce the second bias voltage. Second current-sourcing means biased by the second bias voltage produce, in parallel, a second plurality of switchable currents that each mirror the summed current. Second switching means controlled by the digital value of a higher-order portion of the digital signal selectively switch the second plurality of switchable currents to the second flow path so as to contribute multi-unit steps to the analog signal.

In the preferred embodiment, the digital signal comprises 8 binary bits, 3 bits of which constitute the low-order portion and the remaining 5 bits of which constitute the high-order portion. The number of switched current sources is 38. Each of such 38 sources is defined by 3 FETs, of which one FET serves as a switchable current source and the other two serve as a differential switch. These FETs are positioned to form numerous regular arrays including regular arrays defining switchable current sources and regular arrays defining differential switches. Each of 7 of the FETs has a first W/L ratio, is biased by the first bias voltage, and forms part of an interdigitated array. Each of these 7 FETs operates in its saturation region as a voltage-to-current converting circuit and each converts the first bias voltage to a respective one of 7 switchable currents that each mirror the reference current. These 7 mirrored currents are selectively switched to the output in accord with the discrete value of the lower-order portion of the digital signal. Each of 31 FETs has a second W/L ratio, and produces a current that is selectively switched to the output in accord with the discrete value of the 5-bit higher order portion. These 31 switchable current sources are organized into four separate arrays; 3 of these arrays each comprise 8 switchable current sources, and the other comprises 7 switchable current sources. The circuit means for producing the first bias voltage comprises two pairs of diode-connected FETs; approximately one-quarter of the reference current flows through each of these diode-connected FETs. Each pair is positioned at an opposite end of the interdigitated array. In the interdigitated array, there are 8 FETs defining 8 unswitched current sources. These 8 FETs are positioned alternately with the 7 FETs of the first current-sourcing circuit means. Each of these 8 FETs operates in its saturation region as a voltage-to-orient converting circuit and each converts the first bias voltage to a respective one of 8 unswitched currents that each mirror the reference current. The unswitched currents are combined in a summing node to define the summed current having a magnitude that is a multiple of the magnitude of the reference current. The summing node is defined by a diode-connected FET operating as a current-to-voltage converting circuit that produces an intermediate bias voltage. For each of the 4 arrays of higher-order switchable current sources, there is provided a voltage-to-current converting circuit and a current-to-voltage converting circuit to form a circuit means for producing a separate bias voltage in response to the intermediate bias voltage. Because of the inclusion of the converting circuits between the intermediate bias voltage and the separate bias voltage, the FETs in the second current-sourcing means can be of the same type as those in the first current-sourcing means.

In contrast to the first prior art approach which requires 255 switched current sources in an 8-bit DAC (with 3 FETs each, totalling 765 FETs), the preferred embodiment employs only 38 switched current sources. Taking into account that each of 31 of the 38 switched current sources includes a relatively wide current-sourcing FET, the preferred embodiment is nevertheless more space efficient. Furthermore, the preferred embodiment provides highly linear performance even though significantly fewer FETs are employed.

DETAILED DESCRIPTION

A specific DAC embodying the preferred features of the present invention is part of a CMOS application specific integrated circuit (ASIC) designed for use in a control system for positioning the heads of an intelligent disk drive. A microprocessor within this control system performs calculations and sequentially produces parallel-by-bit bytes; i.e., an 8-bit digital signal. The digital signal is communicated to the ASIC and is converted to analog form within the ASIC. In this specific ASIC, a reference current is generated within the ASIC using circuitry described and claimed in the related patent application referred to above. Such a reference current could alternatively have been generated externally and be supplied to the internal DAC through one of the ASIC's pins. The DAC analog output signal is in the form of a d.c. current. An amplifier responsive to the DAC output signal provides drive current to a motor within a head actuator assembly Within the ASIC, there are conductors for a 12-volt power supply ($V_{CC}$), a 5-volt power supply ($V_{DD}$), and ground ($V_{SS}$). Each power supply has a 10% tolerance: i.e., $V_{CC}$ can range from 10.8 volts to 13.2 volts, and $V_{DD}$ can range from +4.5 volts to +5.5 volts. The CMOS circuitry is made by a 3 micron, single-metal process having process-caused variations in parameters as described above in connection with the description of the prior art.

Figure 1:
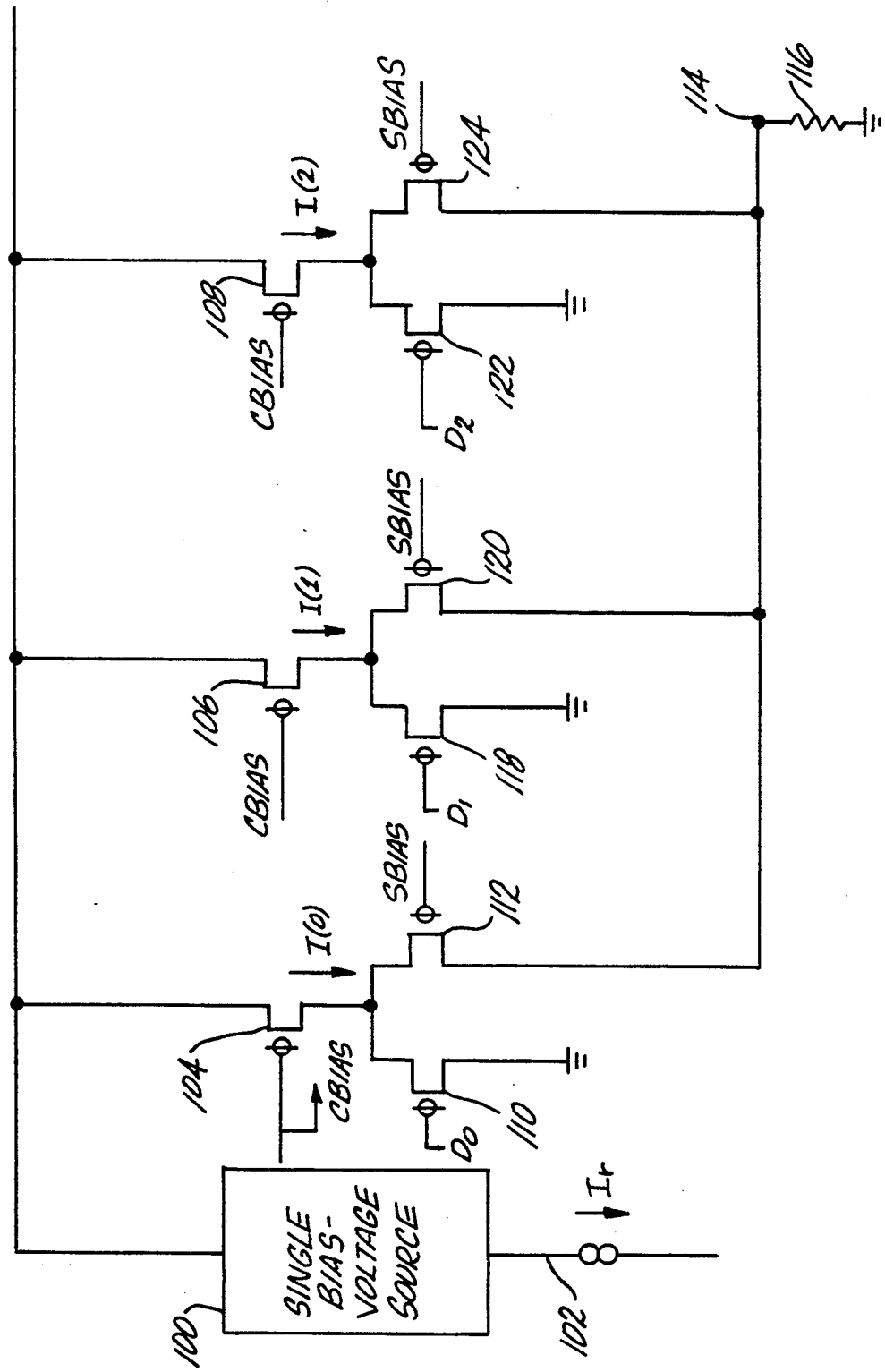
FIG. 1 is a block and schematic diagram showing features of a DAC in accord with one prior art approach in which binary-weighted switched current sources are used.
Figure 2:
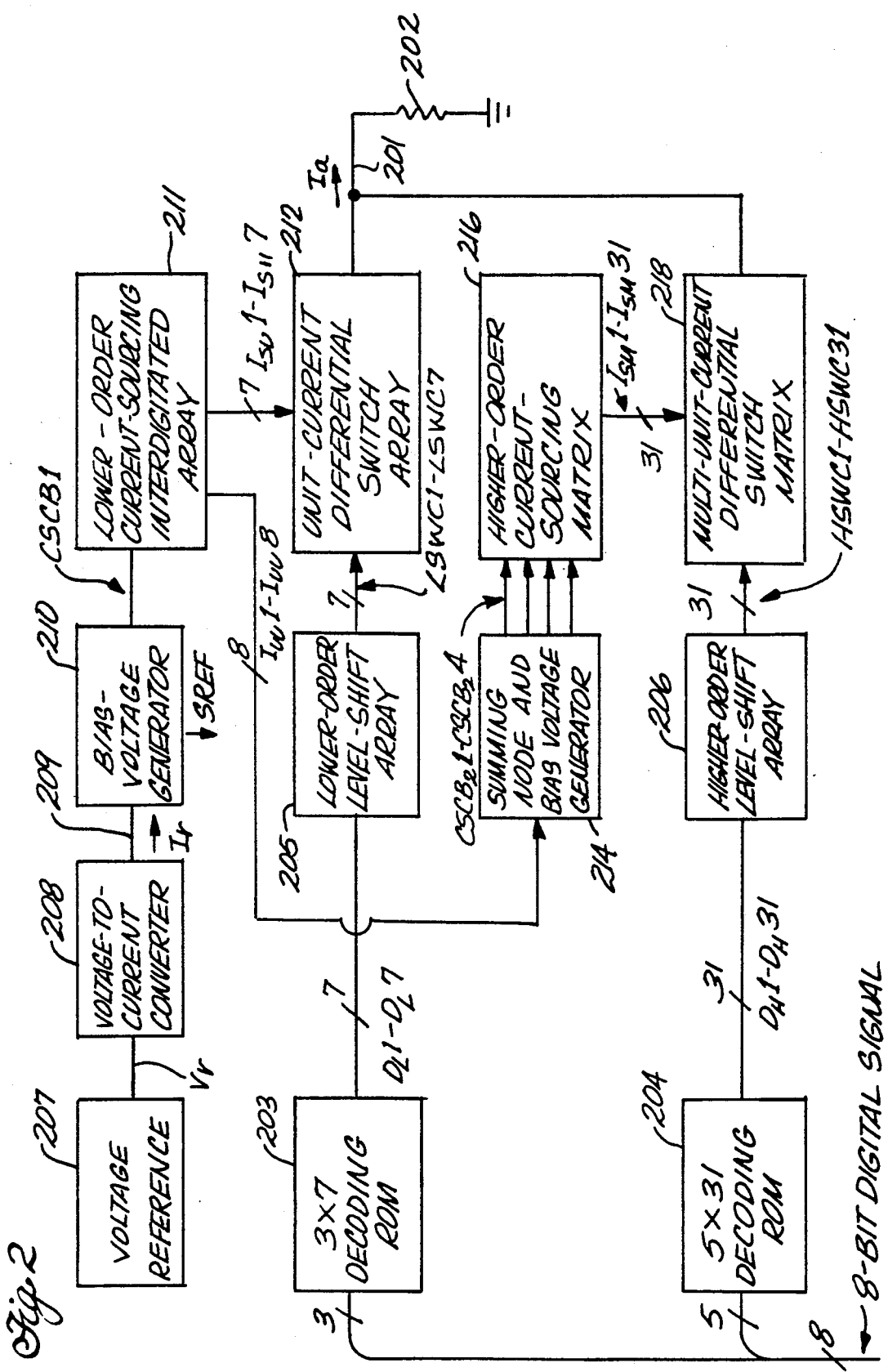
FIG. 2 is a block diagram showing the general organization of a DAC in accord with the preferred embodiment of this invention.

With reference to FIG. 2, there will now be described general features of the overall DAC. The input signals supplied to the DAC are an 8-bit digital signal and a reference voltage $V_r$. The output signal of the DAC is an analog current $I_a$ that flows in a flow path 201. A resistive load 202 through which the analog current flows develops a voltage in proportion to the magnitude of the analog current.

The 8-bit digital input signal comprises a 3-bit parallel lower-order portion and a 5-bit parallel higher-order portion. The binary values of each of these bits are defined by voltage levels referenced to the 5-volt power supply $V_{DD}$.

A 3×7 decoding ROM 203 in the DAC decodes the 3-bit lower-order portion and produces 7 decoded control signals $D_L1$–$D_L7$. A 5×31 decoding ROM 204 decodes the 5-bit higher-order portion and produces 31 decoded control signals $D_H1$–$D_H31$. Because other circuitry in the DAC is referenced to the 12-volt power supply $V_{CC}$, the DAC includes two level-shift arrays. One of these is a lower-order level shift array 205 which produces 7 lower-order switch control signals LSWC1–LSWC7. The other is a higher-order level shift matrix 206 which produces 31 higher-order switch control signals HSWC1–HSWC31.

A voltage reference source 207 external to the ASIC supplies the reference voltage $V_r$ to a voltage-to-current converting circuit 208 within the ASIC. The construction and operation of circuit 208 is disclosed in the patent application identified above in the cross reference to a related application. A reference current $I_r$ produced by circuit 208 flows in a flow path 209.

A bias-voltage generator 210 is connected to flow path 209 and produces a first current-sourcing-circuit bias voltage CSCB1 which is referenced to the 12-volt power supply $V_{CC}$. Generator 210 also produces a switch-reference voltage SREF.

A lower-order, current-sourcing, interdigitated array 211 is biased by CSCB1 and produces, in parallel, 15 separate unit currents each of which mirrors the reference current $I_r$. The 15 separate unit currents comprise 7 switchable unit currents $I_{su}1$–$I_{su}7$ and 8 unswitched unit currents $I_{uu}1$–$I_{uu}8$.

A unit-current differential switch array 212 is controlled by lower-order switch control signals LSWC1–LSWC7, and provides for selectively switching the seven switchable unit currents to DAC output flow path 201 so that each current so selected contributes a unit step to the analog current. Each differential switch in array 212 is biased by the SREF voltage.

A summing node and bias-voltage generator 214 internally produces a summed current having a magnitude that is equal to the sum of the 8 unswitched unit currents. Generator 214 supplies 4 current-sourcing bias voltages $CSCB_21$ through $CSCB_24$ to a higher-order current-sourcing matrix 216. As described in more detail below with reference to FIG. 8, matrix 216 comprises 4 arrays 801, 802, 803, and 804. Each of these 4 current-sourcing-circuit bias voltages is referenced to the 12-volt power supply $V_{CC}$. The 4 arrays of higher-order current sourcing matrix 216, in combination, produce, in parallel, 31 switchable multi-unit currents $I_{sm}1$–$I_{sm}31$.

FIG. 2 further shows a multi-unit-current differential switch matrix 218 which is controlled by higher-order switch control signals HSWC1–HSWC31, and provides for selectively switching the 31 switchable multi-unit currents to DAC output flow path 201 so that each current so selected contributes a multi-unit step to the analog current. Each differential switch in matrix 218 is biased by the SREF voltage. As described in more detail below with reference to FIG. 8, matrix 218 comprises 4 arrays 811, 812, 813, and 814.

Figure 3:
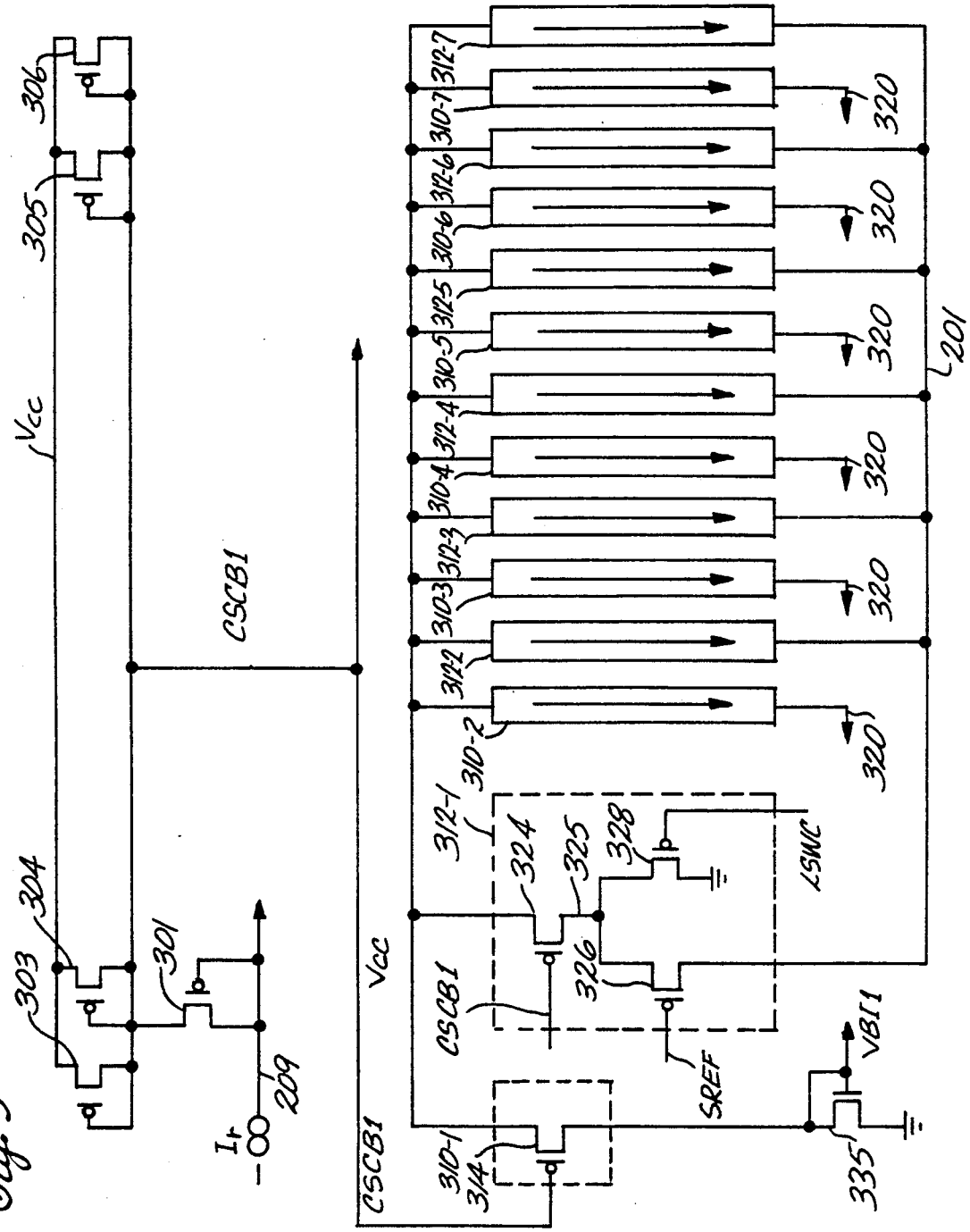
FIG. 3 is a block and schematic diagram showing circuitry incorporated in the preferred embodiment including circuitry for producing a first current-sourcing bias voltage, and circuitry within an array for producing, among other things, parallel unswitched currents that each mirror a reference current.

As shown in FIG. 3, flow path 209 includes a diode-connected p-type FET 301 though which the reference current $I_r$ flows. The voltage drop $V_d$ across FET 301 is given by the following equation:

$$V_d = V_t + \sqrt{(2)(I_r)/(K')(W/L)}$$

As indicated by the foregoing equation, a diode-connected FET serves as a current-to-voltage converting circuit that produces a voltage drop that is a linear function of the FET's MOS threshold voltage $V_t$ and is also a function of the square root of the current being converted.

As a result of the voltage drop across FET 301 and across other FETs described below, the switch reference voltage SREF is produced at the common node of the gate and the drain of FET 301. The source of FET 301 is connected to the drains of 4 diode-connected p-type FETs 303, 304, 305, and 306 which, in combination, form a current-to-voltage converting circuit for producing the first bias voltage CSCB1. Approximately one-quarter of the reference current $I_r$ flows through each these 4 diode-connected FETs. The layout of the DAC is such that FETs 303 and 304 form one pair positioned at one end of interdigitated array 211, and FETs 305 and 306 form another pair positioned at the opposite end of array 211.

As also shown in FIG. 3, interdigitated array 211 defines unswitched current sources 310-1 through 310-8, and cooperates with differential switch array 212 to define switchable unit-current sources 312-1 through 312-7. Each of the unswitched current sources has the same internal construction, and accordingly only one is shown in detail. Likewise, each of the switchable unit-current sources has the same internal construction, and accordingly only one is shown in detail.

As shown in the dashed block surrounding unswitched current source 310-1, a p-type FET 314 has its source connected to the 12-volt power supply $V_{CC}$, its gate connected to be biased by the first bias voltage CSCB1, and its drain connected to a conductor 320. FET 314 is positioned in interdigitated array 211, and conductor 320 extends from interdigitated array 211 to an array of FETs that define summing node and bias voltage generator 214.

As shown in the dashed block surrounding switched current source 310-1, a p-type FET 324 has its source connected to the 12-volt power supply $V_{CC}$, its gate connected to be biased by the first bias voltage CSCB1, and its drain connected via a conductor 325 to a node in common with the sources of 2 p-type FETs 326 and 328. FET 324 is positioned in interdigitated array 211, and conductor 325 extends from interdigitated array 211 to differential switch array 212 where FETs 326 and 328 are positioned. The SREF voltage is applied to the gate of FET 326. The drain of FET 326 is connected to flow path 201. The gate of FET 328 is connected to receive a level-shifted switch control signal, and its drain is connected to $V_{SS}$ (i.e., ground potential).

FIG. 3 also shows an n-type FET 335 that forms a summing node into which all 8 of the unswitched currents flow. FET 335 is diode-connected to serve as a current-to-voltage converting circuit that produces an intermediate bias voltage VBI1. This intermediate bias voltage is applied to circuitry (shown in FIG. 4) that produces a separate bias voltage for each the 4 arrays of current sourcing FETs in matrix 216.

Figure 4:
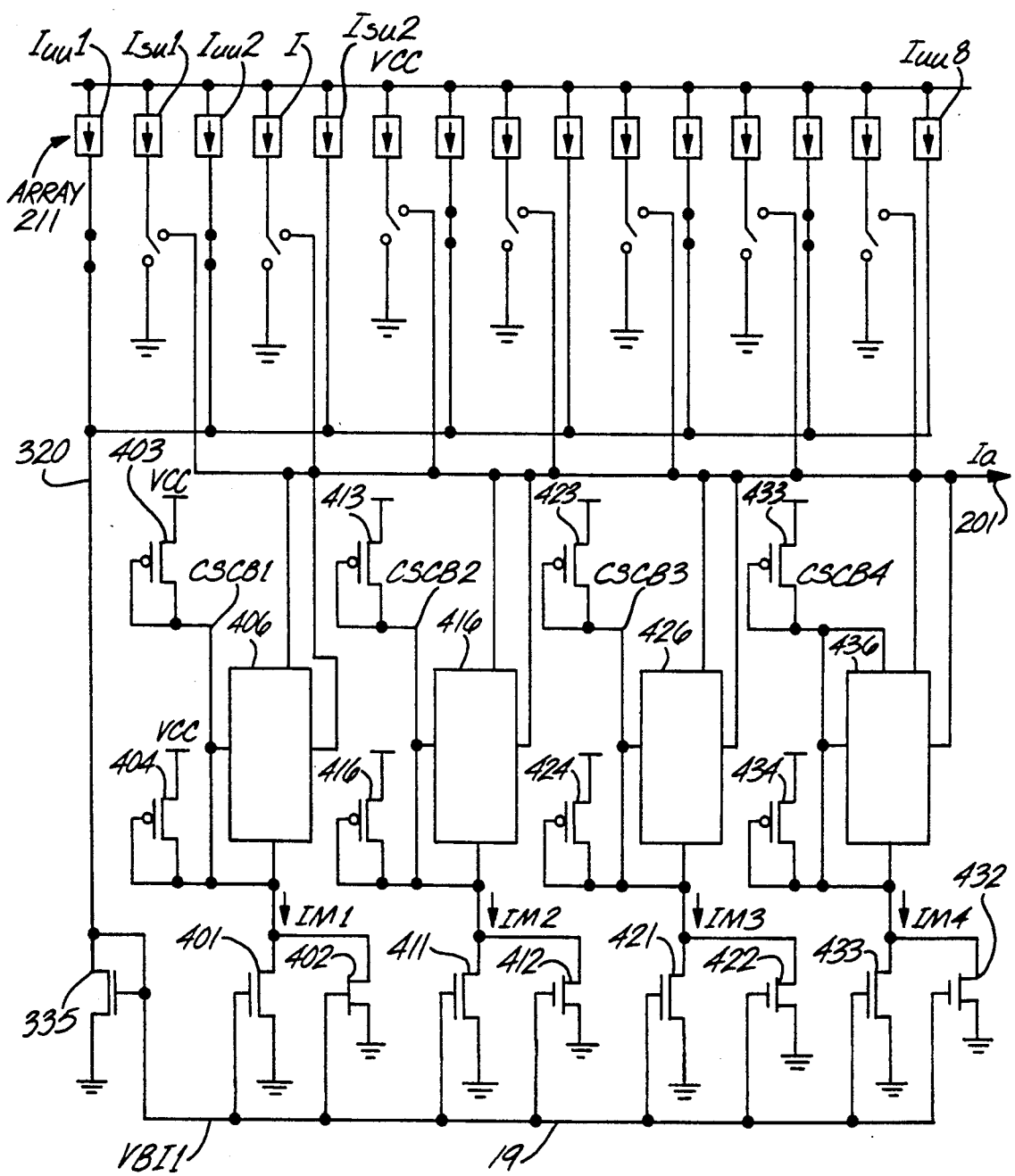
FIG. 4 is a block and schematic diagram showing, in the context of a substantially overall block diagram of the preferred embodiment, a schematic-level representation of circuitry for producing multiple bias voltages that each have a magnitude that depends upon a summed current.

FIG. 4 provides an additional block and schematic diagram that is useful in explaining the construction and operation of the preferred embodiment.

In FIG. 4, the 15 current-sourcing FETs within interdigitated array 211 are depicted diagrammatically. Likewise, the 7 differential switches in array 212 are depicted diagrammatically. The 8 unswitched unit currents $I_{uu}1-I_{uu}8$ flow via conductor 320 to diode-connected FET 335. The 7 differential switches through which the switched currents $I_{su}1$ through $I_{su}7$ flow either steer the respective current to ground or to conductor 201 so as to contribute to the analog-current signal $I_a$ flowing in flow path 201.

FIG. 4 also shows a pair of n-type FETs 401 and 402 that are biased by the intermediate bias voltage VBI1 to produce a mirrored current IM1 that mirrors the summed current flowing through FET 335. The mirrored current IM1 divides approximately equally between 2 p-type diode-connected FETs 403 and 404 that are part of, and positioned at opposite ends of array 801 (FIG. 8) that also includes 8 FETs biased by bias voltage $CSCB_21$ produced by FETs 403 and 404. The 8 FETs so biased produce switchable multi-unit-currents $I_{sm}1-I_{sm}8$. These switchable currents are switched by differential switches of array 811 (FIG. 8) in matrix 218. In FIG. 4, the combination of current-sourcing FETs of array 801 and differential switches of array 811 is depicted as multi-unit switched current sources 406.

Another pair of n-type FETs 411 and 412 are also biased by the intermediate bias voltage VBI1. These FETs produce a mirrored current IM2 that also mirrors the summed current flowing through FET 335. The mirrored current IM2 divides approximately equally between 2 p-type diode-connected FETs 413 and 414 that are part of, and positioned at opposite ends of array 802 (FIG. 8) that also includes 8 FETs biased by bias voltage $CSCB_22$ produced by FETs 413 and 414. The 8 FETs so biased produce switchable multi-unit-currents $I_{sm}9-I_{sm}16$. These switchable currents are switched by differential switches of array 812 in matrix 218. In FIG. 4, the combination of current-sourcing FETs of array 802 and differential switches of array 812 is depicted as multi-unit switched current sources 416.

Another pair of n-type FETs 421 and 422 are also biased by the intermediate bias voltage VBI1. These FETs produce a mirrored current IM3 that also mirrors the summed current flowing through FET 335. The mirrored current IM3 divides approximately equally between 2 p-type diode-connected FETs 423 and 424 that are part of, and positioned at opposite ends of array 803 (FIG. 8) that also includes 8 FETs biased by bias voltage $CSCB_23$ produced by FETs 423 and 424. The 8 FETs so biased produce switchable multi-unit-currents $I_{sm}17-I_{sm}24$. These switchable currents are switched by differential switches of array 813 (FIG. 8) in matrix 218. In FIG. 4, the combination of current-sourcing FETs of array 803 and differential switches of array 813 is depicted as multi-unit switched current sources 426.

Another pair of n-type FETs 431 and 432 are also biased by the intermediate bias voltage VBI1. These FETs produce a mirrored current IM4 that also mirrors the summed current flowing through FET 335. The mirrored current IM4 divides approximately equally between 2 p-type diode-connected FETs 433 and 434 that are part of, and positioned at opposite ends of array 804 (FIG. 8) that also includes 7 FETs biased by bias voltage $CSCB_24$ produced by FETs 433 and 434. The 7 FETs so biased produce switchable multi-unit-currents $I_{sm}25-I_{sm}31$. These switchable currents are switched by differential switches of array 814 (FIG. 8) in matrix 218. In FIG. 4, the combination of current-sourcing FETs of array 804 and differential switches of array 814 is depicted as multi-unit switched current sources 436.

Figure 5:
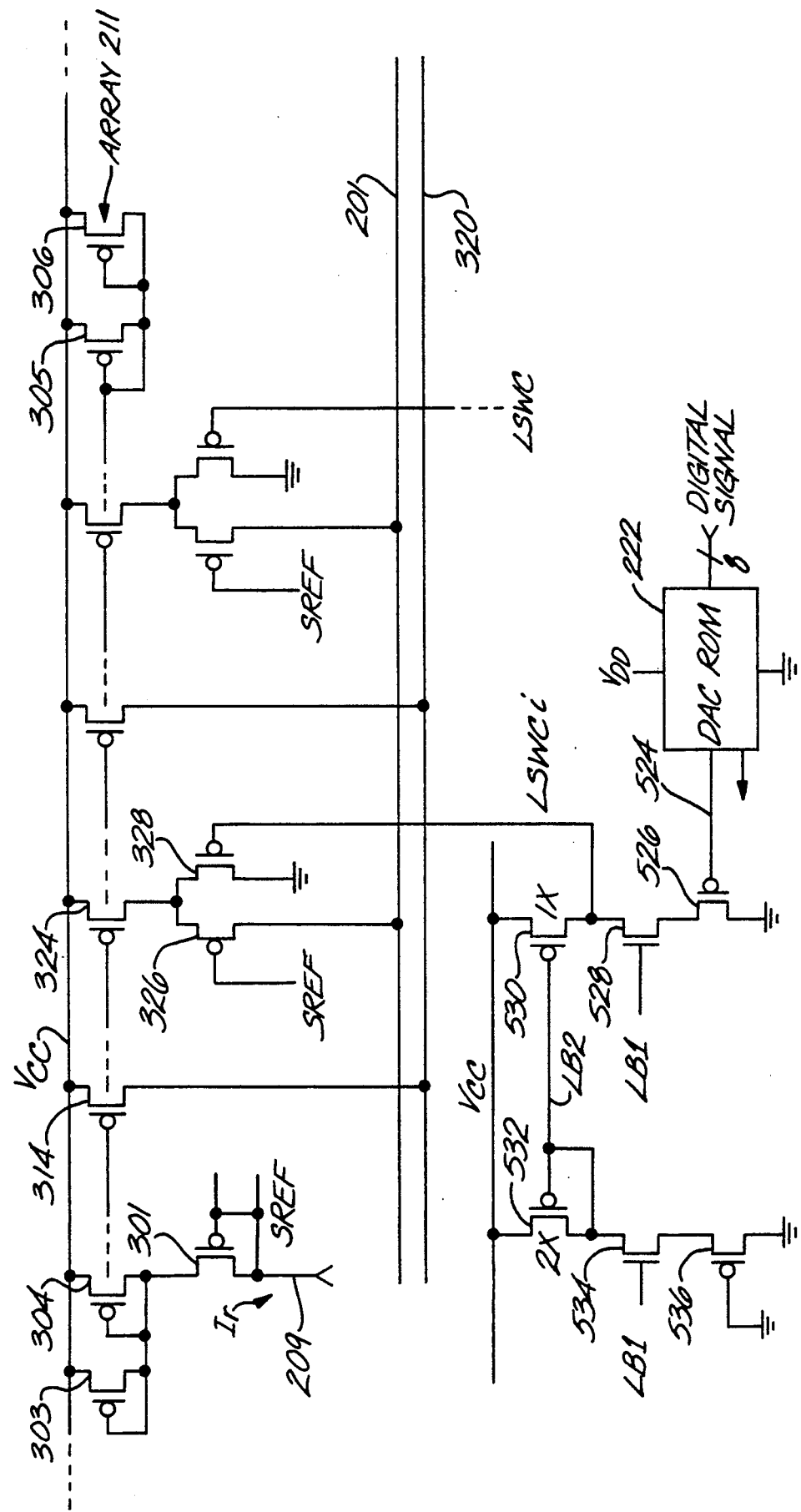
FIG. 5 is a schematic diagram showing a highly advantageous circuit arrangement that is replicated in level shift arrays within the preferred embodiment, and showing the manner in which this circuit is connected to a representative differential switch that is replicated in another array.

With reference to FIG. 5, there will now be described a highly advantageous level-shift circuit comprising 3 FETs 526, 528, and 530. There are 38 of these level-shift circuits in the level-shift arrays 205 and 206. Each of these level-shift circuits produces a respective one of the 38 level-shifted switch control signals for the differential switches.

The DAC ROMs decode the multi-bit digital to produce parallel, binary-valued control signals that are each referenced to the 5-volt power supply $V_{DD}$. A representative one of these control signals is applied to a conductor 524. Nominally, this representative control signal is at or near 0 volts to represent a control value for turning a switched current source off, and at or near 5 volts to represent a control value for turning the switched current source on. This representative control signal controls the switching of the differential switch in switched current source 312-1.

In the level-shift circuit, p-type FET 526 has its gate connected to conductor 524 to receive this control signal, its drain is grounded, and its source is connected to form a series connection with n-type FET 528 and p-type FET 530 between the 12-volt power supply $V_{CC}$ and ground. The gate of FET 526 is connected to receive a first level-shift bias voltage LB1. The gate of FET 528 is connected to receive a second level-shift bias voltage LB2.

A 3-FET bias-source circuit produces the bias voltage LB2 for all 38 of the level-shift circuits. This circuit comprises a diode-connected p-type FET 532, an n-type FET 534, and a p-type FET 536. FET 536 is matched to FET 526, and FET 534 is matched to FET 524. FET 532 is sized to have twice the W/L ratio of FET 530.

The level-shifted control signal LSWC1 is defined at the node to which the drain of n-channel FET 528 and the source of p-channel FET 530 are connected. The 0 to 5 volt signal excursion in the input signal to the p-channel FET 526 is converted to nominally a 5 to 12 volt signal on the drain of the n-channel FET 528. With its level-shifted switch control signal being at approximately 12 volts, p-channel FET 328 turns off so that the other FET 326 of the differential switch turns on and steers current to the DAC output. As previously described, the SREF voltage that biases FET 326 in the differential switch has a level of approximately two diode drops below the 12-volt power supply $V_{CC}$.

The level shift reduces the glitch energy which may be passed to the n-channel FET 528 by limiting the voltage swing on the switching node. Further, the hot electron effect due to impact ionization in the n-channel FET is avoided by maintaining a maximum of 5 volts nominal drop across the n-channel FET.

Figure 6:
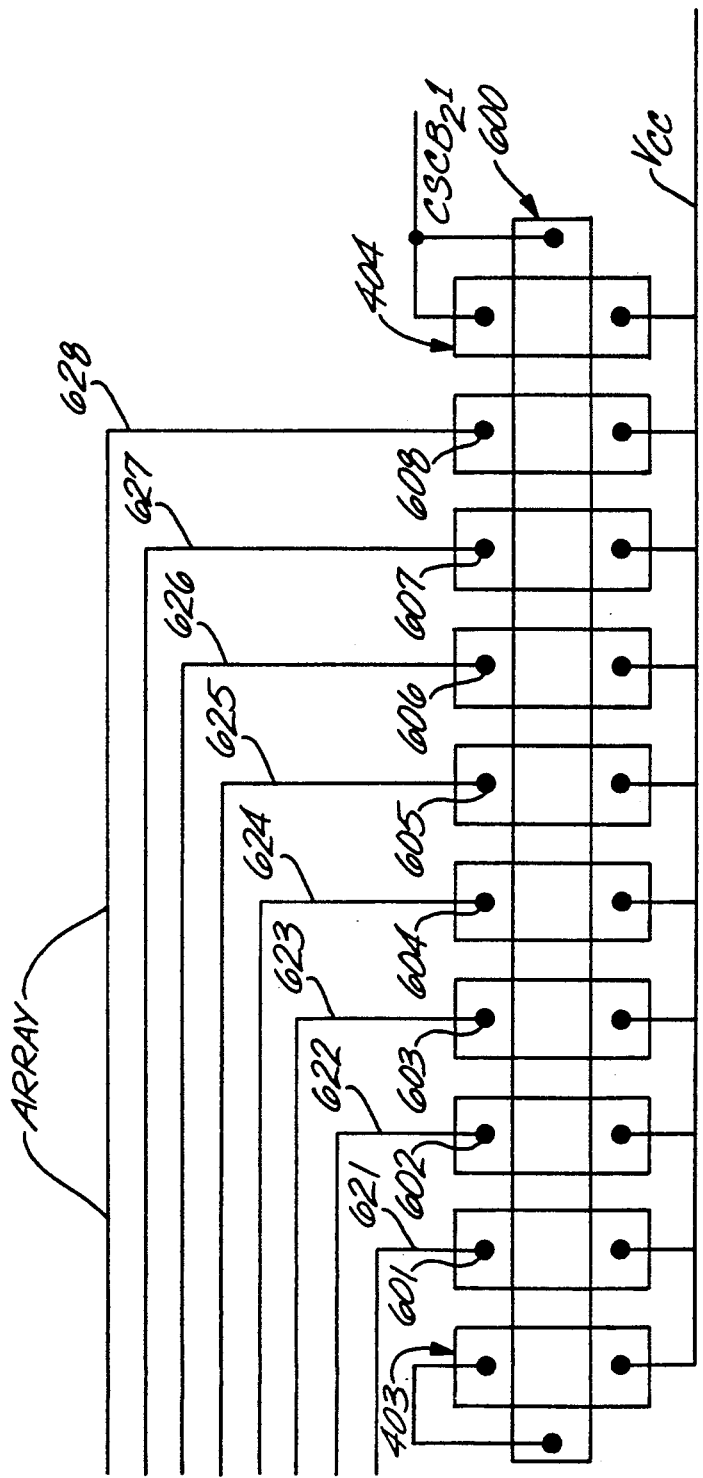
FIG. 6 is a diagrammatic plan view of an array of FETs which are commonly biased by one of the multiple bias voltages produced by circuitry shown in FIG. 4.

FIG. 6 shows diagrammatically the layout of FETs forming a regular array 801, which is one of the four multi-unit-current sourcing arrays within matrix 216. Array 801 includes 8 current-sourcing FETs. Each of these 8 FETs is sized for an 8-unit current; i.e., its W/L ratio is 8 times the W/L ratio that each current-sourcing FET in interdigitated array 211 has. The FETs of array 801 are aligned or nearly aligned into a single array having a common gate electrode 600. The drain contacts of the FETs are designated 601, 602, 603, 604, 605, 606, 607, and 608. The drain contacts are connected, respectively, to metal conductors 621, 622, 623, 624, 625, 626, 627, and 628 defined in a metal layer. In this symbolic layout, each round dark circle represents a contact hole in which the metal interconnect layer makes contact to either the polysilicon layer or to the active semiconductor layer. The solid lines terminated with the dark circle represent conductors defined in the metal interconnect layer. The shaded layer is the polysilicon layer which acts as a second interconnect layer or as the gate electrode of the FETs. The unshaded enclosed region represents the thin oxide layer. The thin oxide layer is used to form isolated regions of semiconductor that define the source and drain regions of the FETs.

FIG. 6 also shows that each of the two diode-connected FETs 403 and 404, which are schematically depicted in FIG. 4, is located at an opposite end of the aligned array. The input bias current to the array enters the drain contacts of the diode-connected FETs 403 and 404. For this array, the common centroid is at the center of the array and is nearly equally distant from both diode-connected FETs 403 and 404. The input bias current applied to the diode-connected FETs produces a gate bias voltage $CSCB_21$ for the 8 current-sourcing FETs in the array. Provided that the 8 current-sourcing FETs remain saturated, a nearly equal drain current is produced by each of them.

Figure 7:
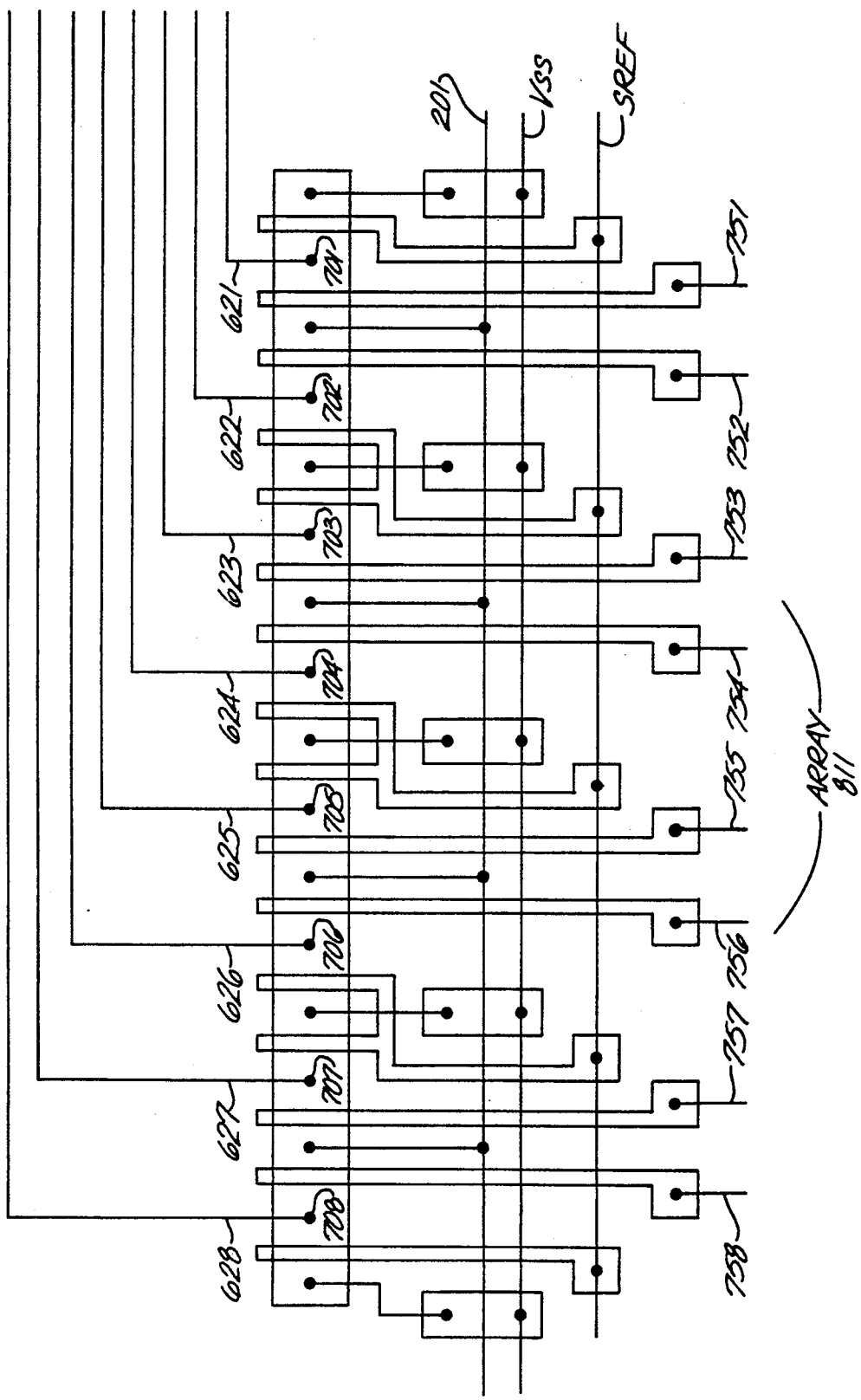
FIG. 7 is a diagrammatic plan view of an array of FETs which define differential switches that are connected to FETs in the array shown in FIG. 6.

FIG. 7 shows diagrammatically the layout of FETs forming a regular array 811, which is one of the four differential switch arrays within matrix 218 and which, in combination with array 801, forms multi-unit switched current sources 406. The metal conductors 621, 622, 623, 624, 625, 626, 627, and 628 carry the switchable currents from the 8 current-sourcing FETs shown in FIG. 6 to corresponding contacts 701, 702, 703, 704, 705, 706, 707, and 708 shown in FIG. 7. Each of these contacts provides a connection to the sources of a pair of FETs that form one of 8 differential switches in array 811. In each differential switch, the drain of one of the pair of FETs at a common current return node (shown as $V_{SS}$ - ground). The drain of the other FET of the pair is connected to the DAC output current flow path 201. Each of the 8 FETs that has its drain connected to the DAC output flow path has its gate electrode connected to the common node SREF. FIG. 7 shows that the level-shifted signal inputs to the differential switch array have nearly equal lengths of polysilicon interconnect at 751, 752, 753, 754, 755, 756, 757 and 758, which correspond to the numerical order of the switched currents and the differential switches. This layout technique introduces nearly equal delay for each differential switch element. This is important in maintaining minimum delay skew between codes changes and thereby improving conversion rate.

Together, the layout technique of FIGS. 6 and 7 allows the current sources to be in close proximity to each other, which improves device matching. The use of two diode-connected FET's, located at opposite ends of an array such as array 801, for producing a current-sourcing bias voltage such as $CSCB_21$, provides numerous advantages. These advantages include a reduced sensitivity to processing gradients, because the common gate voltage is established by the electrical parameters of two devices at each end of the aligned array of FETs. Further, the current-sourcing FETs are in closer proximity to the common centroid and each other, and improved matching to the diode connected devices results from statistical averaging of the electrical parameters of the two diode connected FETs.

Figure 8:
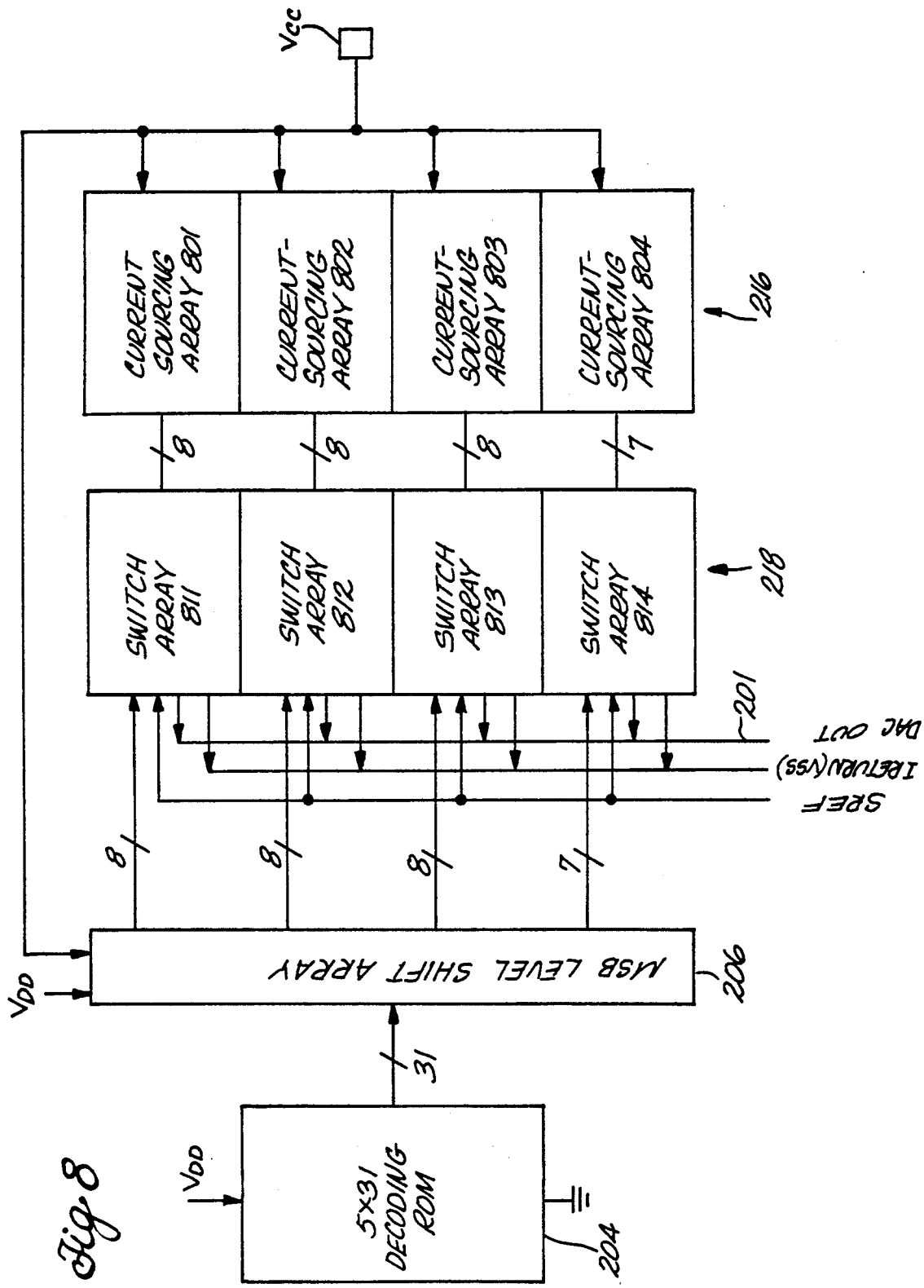
FIG. 8 is a simplified diagrammatic plan view of an arrangement of various arrays incorporated in the preferred embodiment.

FIG. 8 shows the arrangement of arrays which form matrix 216 and 218 and which, in combination, define 31 switchable, multi-unit current sources and 31 differential switches controlled by the upper 5 bits of the input digital signal. The matrix 216 comprises arrays 801, 802, 803, and 804. The matrix 218 comprises arrays 811, 812, 813, and 814. Array 801 provides, in parallel, 8 switchable currents $I_{sm}1-I_{sm}8$ to array 811. Array 802 provides, in parallel, 8 switchable currents $I_{sm}9-I_{sm}16$ to array 812. Array 803 provides, in parallel, 8 switchable currents $I_{sm}17-I_{sm}24$ to array 813. Array 804 provides, in parallel, 7 switchable currents $I_{sm}25-I_{sm}31$ to array 814. Arrays 802 and 803 have the identical construction as that depicted in FIG. 6 for array 801. Array 804 is very similar in construction, except one current-sourcing FET is eliminated. This FET is eliminated so that the common centroid is properly located and to improve matching in the last array.

Figure 9:
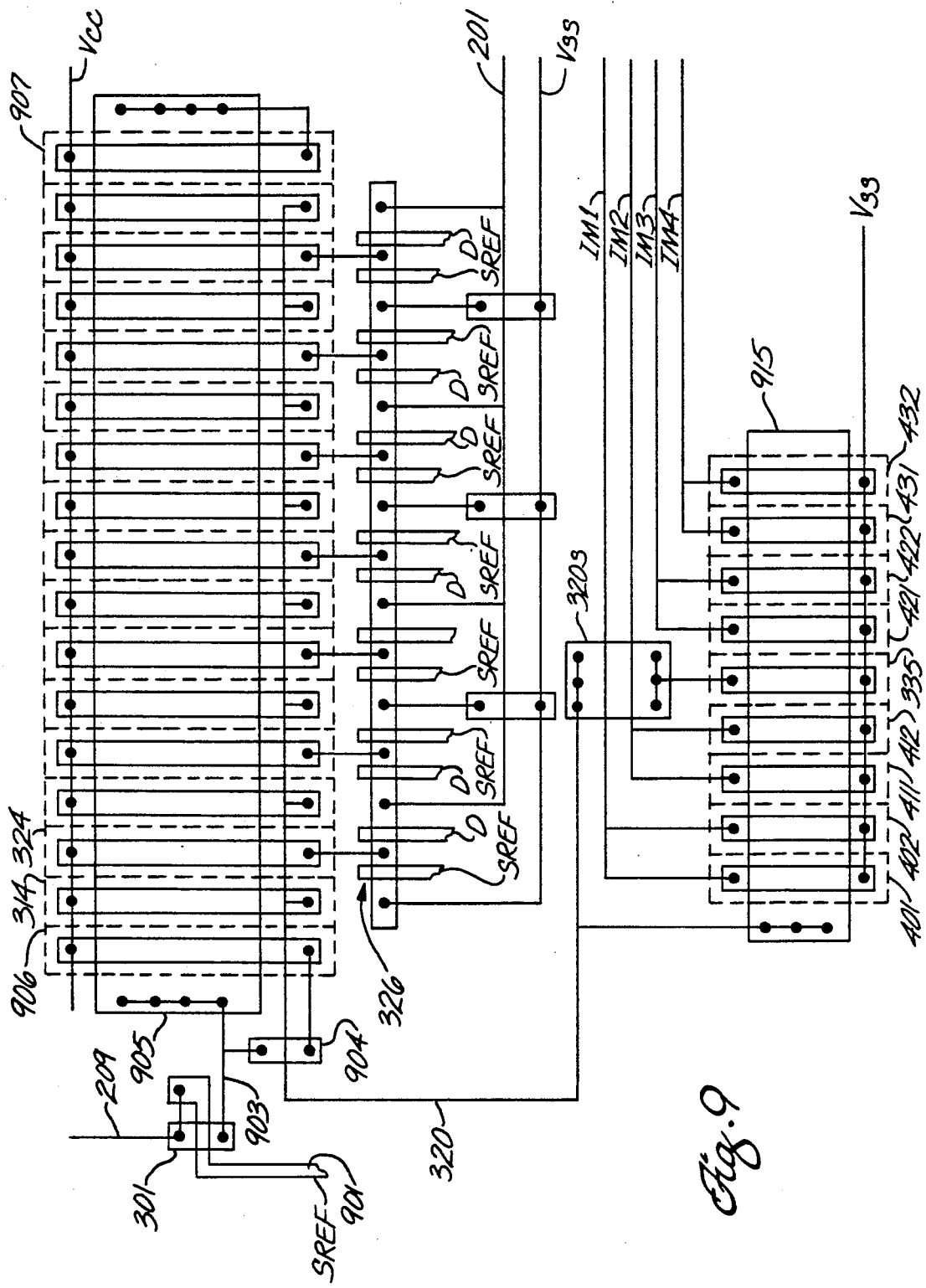
FIG. 9 is a diagrammatic plan view of circuitry shown schematically in FIGS. 3 and 4.

FIG. 9 shows diagrammatically the layout of FETs shown schematically in FIGS. 3 and 4. In FIG. 9, current flow path 209 is shown as a metal conductor connected via contact holes to the polysilicon gate and to the drain of FET 301. The SREF voltage produced by FET 301 is distributed via a polysilicon conductor 901.

A metal conductor 903 is connected via contact holes to the source of FET 301, to one end of a relatively-short polysilicon bridging conductor 904, and to a relatively-long polysilicon conductor 905 that defines the common gate of 17 FETs. Two of the 17 FETs (906 and 907) perform the functions of the two pairs of FETs (303 and 304, and 305 and 306) shown in FIG. 3. The other 15 FETs define the interdigitated array 211.

Conductor 320, which connects to the drains of the 8 unswitched current sources is shown as being defined in part by a metal conductor 320m, and in part by a short, polysilicon bridging conductor 320s. The drain of FET 335 is connected to polysilicon conductor 320s. The gates of FET 335 and of each of the pairs of FETs that produce the mirrored currents IM1–IM4 are defined by polysilicon conductor 915.

Flow path 201 which carries the $I_a$ analog current signal is shown as a metal conductor connected to 4 nodes each of which constitutes the common drains of two FETs of differential switch array 212.

The preferred embodiment provides highly linear performance in part because of the physical layout described above with reference to numerous drawings. The physical layout facilitates common centroid switching. The decoding ROMs 203 and 204 are organized to take advantage of common centroid switching. An example of operation to illustrate this point involves a sequence of consecutive bytes corresponding to the decimal numbers 0, 1, 2, 3, etc. While the input byte equals decimal 0, none of the 38 decoded signals produced by ROMs 203 and 204 is asserted, and all 38 of the switched current sources is off so that $I_a$ equals 0. While the input byte equals decimal 1, decoded signal $D_L1$ is asserted; in response, differential switch 312-4 is on so that the switchable current supplied by the center FET in interdigitated array 211 is switched to output path 201, whereby $I_a$ has a unit value. While the input byte equals decimal 2, decoded signals $D_L1$ and $D_L2$ are asserted; in response, differential switches 312-4 and 312-3 are on so that the switchable currents supplied by the center FET and the FET adjacent to it on one side in interdigitated array 211 are switched to output path 201, whereby $I_a$ has a 2-unit value. While the input byte equals decimal 3, decoded signals $D_L1$, $D_L2$, and $D_L3$ are asserted; in response, differential switches 312-4, 312-3, and 312-5 are on so that the switchable currents supplied by the center FET and both FETs adjacent to it in interdigitated array 211 are switched to output path 201, whereby $I_a$ has a 3-unit value. Because the sequence begins with the center and proceeds on an alternating basis outwardly from the center, process gradient effects are thereby limited in affecting the accuracy of the output. This improves integral non-linearity at a cost of a slight degradation of differential non-linearity.

Providing separate biasing structures for the current-sourcing arrays eliminates errors due to process tolerancing on device width. High accuracy in linearity and monotonicity results in part from the biasing of the current sources for the multi-unit-current sources by mirroring current from the sum of the currents produced by the 8 non-switchable current sources of interdigitated array 211. High accuracy in linearity and monotonicity also results in part from the sizing of the current-sourcing FETs of in matrix 216, at eight times the size of the current-sourcing FETs of array 211.

Various modifications can be made to the preferred embodiment within the scope of the present invention. For example, decoding of an input byte can be on the basis of a 4-bit lower order portion and a 4-bit higher-order portion (briefly referred to as a 4-bit and 4-bit architecture). Although a 4-bit by 4-bit architecture with multiple-biasing structures is within the scope of the present invention, the 3-bit and 5-bit architecture of the preferred embodiment has significant advantages with respect to accuracy. The 4-bit and 4-bit architecture requires each multi-unit to be 16 times the current of a unit current. With the 3-bit and 5-bit architecture, the multi-unit current is reduced from 16 LSB unit currents to 8 LSB unit currents. Further, MSB switching is accomplished between a value of seven LSB unit currents and one MSB unit current. In a worst case having tolerance variation of +2% for the LSB current generators, and tolerance variation of −2% for the MSB current generator, the value of the LSB current generator would be 7.14 LSB unit currents (7 times 1.02), while the MSB current generator value would be 7.84 LSB unit currents (0.98 times 8), yielding a net positive difference of 0.7 LSB unit currents or 30% of an LSB unit current (or 0.3 LSB) error. Repeating the previous example for a 4 bit plus 4 bit architecture, 15 LSB current generators at maximum tolerance would provide 15.30 LSB unit currents, and 1 MSB current generator at minimum tolerance would produce 15.68 LSB unit currents, resulting in a 0.38 LSB current differential or a 62% of an LSB unit current error. The 3-bit and 5-bit architecture, therefore, provides an effective doubling of accuracy in the digital-to-analog converter without requiring increased process refinement to limit $V_t$ variation.

The complexity added by employing the 3-bit and 5-bit architecture is minimal, requiring only eight more switched current sources than the 30 which are required with the 4-bit and 4-bit architecture.

As to another alternative, viz, a 2-bit and 6-bit architecture, this alternative would provide an additional doubling of accuracy, but at the price of significantly increased complexity. Sixty-six switched current sources would be required for the 2-bit and 6-bit architecture. In addition, the current per switch is significantly reduced, which often may result in larger device size, requiring more die space and resulting in a larger chip.

The preferred embodiment of the invention provides numerous novel and advantageous features. The interdigitated array of MOS current sources provides improved matching accuracy between the switched and unswitched unit currents. The matching accuracy results from interdigitizing, which brings a switched unit current MOS device into close proximity to the unswitched counterpart. Also, the summing of multiple unswitched unit currents provides reduction in the variance by oversampling (by averaging) the unit currents across the array. The average of the seven unit currents shall approach the average of the eight unit currents, with less statistical variation than by simple mirroring eight unit currents directly from the single diode connected MOS transistor. The use of even multiple diode connected transistors as described provides an effective diode connected device located at the center of the array while reducing the physical separation between all matched elements in that array. The switched unit currents are activated by the logical output of the 3×7 decoder which may provide common centroid decoding to reduce the integral non-linearity.

The preferred embodiment of the invention also provides multiple bias voltage means for the switchable currents that provide multi-unit current steps to the analog output. The use of multiple bias voltages reduces the non-linearity resulting from process gradients by providing a bias localized to the devices in the respective arrays. Since the diode connected devices are in closer to each element of the respective array, improved matching results over using a single bias voltage supplied to all multi-unit current source FETs. Likewise the use of even multiple diode connected devices places the effective diode connected device at the center of the local array without increasing spacial separation between the MOS transistor current sources. With this arrangement, it is not necessary to use two dimensional common centroid decoding to improve the integral non-linearity. Instead, one dimensional common centroid decoding may be used for each array until the local array is exhausted. Then the elements of the next local array are selected in a one dimensional common centroid arrangement and so on. This simplifies the physical layout of the DAC which in turn reduces the total die area of the DAC having equivalent accuracy.

We claim:

1. An integrated circuit comprising a converter for converting a multi-bit digital signal to an analog signal, the converter comprising:

means defining a first flow path for a reference current;

current-to-voltage converting circuit means connected to the first flow path for producing a first bias voltage having a magnitude that depends upon the magnitude of the reference current;

means defining a second flow path for an analog current, the magnitude of which defines the analog signal;

first current-sourcing means biased by the first bias voltage for producing, in parallel, a first plurality of switchable currents that each mirror the reference current;

first switching means controlled by the digital value of a low-order portion of the digital signal for selectively switching the first plurality of switchable currents to the second flow path so as to contribute unit steps to the analog signal;

circuit means biased by the first bias voltage for producing a summed current having a magnitude that is a multiple of the magnitude of the reference current;

circuit means responsive to the summed current for producing a second bias voltage;

second current-sourcing means biased by the second bias voltage for producing, in parallel, a second plurality of switchable currents that each mirror the summed current; and second switching means controlled by the digital value of a higher-order portion of the digital signal for selectively switching the second plurality of switchable currents to the second flow path so as to contribute multi-unit steps to the analog signal.

2. An integrated circuit in accord with claim 1, wherein the circuit means for producing the summed current includes a plurality of current-sourcing means biased by the first bias voltage for producing, in parallel, a plurality of unswitched currents, and further includes means defining a summing junction into which all the unswitched currents flow.

3. An integrated circuit in accord with claim 2, wherein the current-sourcing means for producing the unswitched currents are positioned to form an array.

4. An integrated circuit in accord with claim 3, wherein the current-sourcing means for producing the switchable currents that mirror the reference current are positioned in the same array as the means for producing the unswitched currents.

5. An integrated circuit in accord with claim 1, wherein the converter is constructed with CMOS FETs, and wherein the current-to-voltage converting means includes a plurality of diode-connected FETs for producing the first bias voltage.

6. An integrated circuit in accord with claim 1 wherein the converter is constructed with CMOS FETs, and wherein the current-sourcing means for producing the unswitched currents comprise a plurality of FETs positioned in an array, and wherein a plurality of the diode-connected FETs are connected to a common conductor that extends across the array and is connected to the gate of each of the unswitched-current producing FETs.

7. An integrated circuit in accord with claim 1, wherein each current-sourcing means includes a plurality of FETs each operating in its saturation region as a voltage-to-current converting circuit.

8. An integrated circuit in accord with claim 7, wherein the type of FET that is incorporated in the first current-sourcing means is the same as the type of FET that is incorporated in the second current-sourcing means, and wherein the circuit means for producing the second bias voltage includes means for mirroring the summed current, and diode-connected FETs for converting the mirrored summed current to the voltage that constitutes the second bias voltage.

9. An integrated circuit in accord with claim 1, wherein the digital signal comprises eight binary bits, three bits of which constitute the low-order portion and the remaining five bits of which constitute the high-order portion.

10. An integrated circuit in accord with claim 9, wherein the number of switchable currents that each mirror the reference current is seven, and wherein the circuit means for producing the summed current comprises eight FETs each operating in its saturation region as a voltage-to-current converting circuit.

11. An integrated circuit in accord with claim 1, wherein the first and second switching means each include a plurality of level-shift circuits.

12. An integrated circuit in accord with claim 11, wherein each of the level-shift circuits includes three series-connected FETs.

13. A digital-to-analog converter embodied in a CMOS integrated circuit, the converter comprising:

means defining a first flow path for a reference current;

current-to-voltage converting circuit means comprising at least one diode-connected FET connected to the first flow path for producing a first bias voltage having a magnitude that depends upon the magnitude of the reference current;

means defining a second flow path for an analog current, the magnitude of which defines the analog signal;

first current-sourcing means comprising a plurality of FETs each operating in its saturation region as a voltage-to-current converting circuit and each converting the first bias voltage to a respective one of a first plurality of switchable currents that each mirror the reference current;

first switching means controlled by the digital value of a low-order portion of the digital signal for selectively switching the first plurality of switchable currents to the second flow path so as to contribute unit steps to the analog signal;

circuit means biased by the first bias voltage for producing a summed current having a magnitude that is a multiple of the magnitude of the reference current;

circuit means biased by the summed current for producing a second bias voltage;

second current-sourcing means comprising a plurality of FETs each operating in its saturation region as a voltage-to-current converter and each converting the second bias voltage to a respective one of a second plurality of switchable currents that each mirror the summed current; and second switching means controlled by the digital value of a higher-order portion of the digital signal for selectively switching the second plurality of switchable currents to the second flow path so as to contribute multi-unit steps to the analog signal.

14. A digital-to-analog converter in accord with claim 13, wherein the circuit means for producing the summed current includes a plurality of current-sourcing means controlled by the first bias voltage for producing, in parallel, a plurality of unswitched currents, and further includes means defining a summing node into which all the unswitched currents flow.

15. A digital-to-analog converter in accord with claim 14, wherein the current-sourcing means for producing the unswitched currents are positioned to form an array.

16. A digital-to-analog converter in accord with claim 15, wherein the current-sourcing means for producing the switchable currents that mirror the reference current are positioned in the array.

17. A digital-to-analog converter in accord with claim 13, wherein a plurality of diode-connected FETs operate as current-to-voltage converting circuits in the circuit means for producing the bias voltages.

18. A digital-to-analog converter in accord with claim 17, wherein the current-sourcing means for producing the unswitched currents are positioned to form an array, and wherein a plurality of the diode-connected FETs are connected to a common conductor extending across the array.

19. A digital-to-analog converter in accord with claim 17, wherein the current-sourcing means include a plurality of FETs each operating in its saturation region as a voltage-to-current converting circuit.

20. A digital-to-analog converter in accord with claim 19, wherein the type of FET that is incorporated in the first current-sourcing means is the same as the type of FET that is incorporated in the second current-sourcing means, and wherein the circuit means for producing the second bias voltage includes means for mirroring the summed current, and diode-connected FETs for converting the mirrored summed current to the voltage that constitutes the second bias voltage.

21. A digital-to-analog converter in accord with claim 13, wherein the digital signal comprises eight binary bits, three bits of which constitute the low-order portion and the remaining five bits of which constitute the high-order portion.

22. A digital-to-analog converter in accord with claim 21, wherein the number of switchable currents that each mirror the reference current is seven, and wherein the circuit means for producing a summed current comprises eight FETs each operating in its saturation region as a voltage-to-current converting circuit.

23. A digital-to-analog converter embodied in a CMOS integrated circuit, the converter comprising:
 means defining a first flow path for a reference current;
 current-to-voltage converting circuit means comprising a plurality of diode-connected FETs connected to the first flow path for producing a first bias voltage having a magnitude that depends upon the magnitude of the reference current;
 means defining a second flow path for an analog current, the magnitude of which defines the analog signal;
 first current-sourcing means comprising a plurality of FETs each operating in its saturation region as a voltage-to-current converting circuit and each converting the first bias voltage to a respective one of a first plurality of switchable currents that each mirror the reference current;
 first differential switching means controlled by the digital value of a low-order portion of the digital signal for selectively switching the first plurality of switchable currents to the second flow path so as to contribute unit steps to the analog signal;
 circuit means comprising a plurality of FETs each operating in its saturation region as a voltage-to-current converting circuit and each converting the first bias voltage to a respective one of a plurality of unswitched currents that each mirror the reference current;
 diode-connected-FET circuit means connected as a summing node in which the unswitched currents combine to define a summed current having a magnitude that is a multiple of the magnitude of the reference current, the diode-connected-FET circuit means being controlled by the summed current for producing a second bias voltage;
 second current-sourcing means comprising a plurality of FETs each operating in its saturation region as a voltage-to-current converting circuit and each converting the second bias voltage to a respective one of a second plurality of switchable currents that each mirror the summed current; and
 second switching means controlled by the digital value of a higher-order portion of the digital signal for selectively switching the second plurality of switchable currents to the second flow path so as to contribute multi-unit steps to the analog signal.

* * * * *

UNITED STATES PATENT AND TRADEMARK OFFICE
CERTIFICATE OF CORRECTION

PATENT NO. : 5,017,919   Page 1 of 2
DATED : May 21, 1991
INVENTOR(S) : Richard W. Hull; Timothy G. O'Shaughnessy It is certified that error appears in the above-identified patent and that said Letters Patent is hereby corrected as shown below:

In the Drawings:

Sheet 4, FIG. 4, on the top line change "I" to -- Isu2 --, and change "Isu2" to -- Isu3 --.

Sheet 4, FIG. 4, on the bottom group change "433" to -- 431 --.

Column 3, line 31, after "FETs" insert a period.
Column 3, line 61, after "DAC" delete "%".

Column 4, line 56, change "effect" to -- affect --.

Column 5, line 26, change "ordered" to -- order --.

Column 7, line 41, change "orient" to -- current --.

Column 11, line 5, after "each" insert -- of --.
Column 11, line 16, after "flow" insert a comma.

Column 13, line 59, change "codes" to -- code --.

UNITED STATES PATENT AND TRADEMARK OFFICE
CERTIFICATE OF CORRECTION

PATENT NO.   : 5,017,919
DATED        : May 21, 1991
INVENTOR(S)  : Richard W. Hull; Timothy G. O'Shaughnessy It is certified that error appears in the above-identified patent and that said Letters Patent is hereby corrected as shown below:

Column 15, lines 19,20, change "tolerancing" to -- tolerances --.

Column 16, line 37, after "devices are" delete -- in --.

Signed and Sealed this

Thirteenth Day of April, 1993

Attest:

STEPHEN G. KUNIN

*Attesting Officer*   *Acting Commissioner of Patents and Trademarks*